(12) United States Patent
Kesarwani et al.

(10) Patent No.: US 10,181,791 B2
(45) Date of Patent: Jan. 15, 2019

(54) CONVERTER DIGITAL CONTROL CIRCUIT WITH ADAPTIVE COMPENSATION

(71) Applicant: Allegro MicroSystems, LLC, Manchester, NH (US)

(72) Inventors: Kapil Kesarwani, Bedford, NH (US); Mackenzie Tope, West Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/876,641

(22) Filed: Jan. 22, 2018

(65) Prior Publication Data

US 2018/0301985 A1 Oct. 18, 2018

Related U.S. Application Data

(63) Continuation-in-part of application No. 15/487,746, filed on Apr. 14, 2017.

(51) Int. Cl.
*H02M 3/157* (2006.01)
*G05F 5/00* (2006.01)
(Continued)

(52) U.S. Cl.
CPC .......... *H02M 3/157* (2013.01); *G05B 11/42* (2013.01); *G05F 1/575* (2013.01); *G05F 5/00* (2013.01);
(Continued)

(58) Field of Classification Search
CPC ............ G05F 3/26; G05F 3/262; G05F 3/267; H02M 3/156; H02M 3/157;
(Continued)

(56) References Cited

U.S. PATENT DOCUMENTS 8,115,459 B2 * 2/2012 Prodi .................... H02M 3/157
323/222
9,621,041 B2 4/2017 Sun et al.
(Continued)

OTHER PUBLICATIONS

Office Action dated Aug. 29, 2018 for U.S. Appl. No. 15/487,746; 19 Pages.
(Continued)

*Primary Examiner* — Timothy J. Dole
*Assistant Examiner* — Shahzeb K Ahmad
(74) *Attorney, Agent, or Firm* — Daly, Crowley, Mofford & Durkee, LLP

(57) ABSTRACT

A control circuit for a voltage regulator includes a digital compensator having adaptive compensation to permit operation over different operating conditions. The digital compensator includes a gain parameter that is inversely proportional to the input voltage and is independent of the switching frequency. In embodiments, the voltage regulator has a crossover frequency established by at least one pole and at least one zero and the corner frequency of the converter output filter has a first fixed, predetermined relationship with respect to the switching frequency, a second fixed, predetermined relationship with respect to the crossover frequency, and a third fixed, predetermined relationship with respect to the at least one pole and at least one zero.

21 Claims, 5 Drawing Sheets

(51) Int. Cl.
*G05B 11/42* (2006.01)
*H03G 3/00* (2006.01)
*G05F 1/575* (2006.01)
*H02M 1/00* (2006.01)

(52) U.S. Cl.
CPC .... *H03G 3/004* (2013.01); *H02M 2001/0003* (2013.01)

(58) Field of Classification Search
CPC .. H02M 2001/0003; H02M 2001/0016; H03K 3/017
See application file for complete search history.

(56) References Cited

U.S. PATENT DOCUMENTS

| | | | |
|---|---|---|---|
| 2007/0112443 A1* | 5/2007 | Latham | H02M 3/157 700/29 |
| 2009/0121697 A1 | 5/2009 | Aiura et al. | |
| 2010/0052627 A1 | 3/2010 | Otsuka et al. | |
| 2010/0207594 A1* | 8/2010 | Davoudi | H02M 3/157 323/283 |
| 2011/0316511 A1 | 12/2011 | Wang et al. | |
| 2013/0057240 A1* | 3/2013 | Zambetti | H02M 3/156 323/271 |
| 2013/0235628 A1* | 9/2013 | Dong | H02M 7/797 363/47 |
| 2014/0036545 A1* | 2/2014 | Reddy | H02M 3/3376 363/17 |
| 2014/0125306 A1* | 5/2014 | Babazadeh | G05F 5/00 323/285 |
| 2014/0210359 A1 | 7/2014 | Raval et al. | |
| 2015/0188417 A1 | 7/2015 | Hou et al. | |
| 2017/0126119 A1 | 5/2017 | Bernardon | |
| 2017/0264185 A1 | 9/2017 | Karlsson et al. | |
| 2017/0294837 A1 | 10/2017 | Li | |

OTHER PUBLICATIONS

U.S. Appl. No. 15/487,746, filed Apr. 14, 2017, Kesarwani.
U.S. Appl. No. 15/453,039, filed Mar. 8, 2017, Raval et al.
Hagen et al. "Applying Digital Technology to PWM Control-Loop Designs", Texas Instruments Application Note, 28 pages.
Pasternak et al. "Design Considerations for Digitally Controlled Buck Converters with Large Input Transients", IEEE, Apr. 2016, 7 pages.
Patella et al. "High-Frequency Digital PWM Controller IC for DC-DC Converters", IEEE, Transactions on Power Electronics, vol. 18, No. 1, Jan. 2003, 9 pages.
Response to Office Action filed Oct. 26, 2018 for U.S. Appl. No. 15/487,746, 13 pages.

* cited by examiner

CONVERTER DIGITAL CONTROL CIRCUIT WITH ADAPTIVE COMPENSATION

CROSS REFERENCE TO RELATED APPLICATIONS

This application is a Continuation-in-Part (CIP) application of and claims the benefit of and priority to U.S. patent application Ser. No. 15/487,746, filed on Apr. 14, 2017, which application is incorporated by reference herein in its entirety.

STATEMENT REGARDING FEDERALLY SPONSORED RESEARCH

Not Applicable.

FIELD

This disclosure relates generally to control circuits, and more particularly, to adaptive compensation for digitally controlled voltage mode DC-DC converters.

BACKGROUND

As is known, DC-DC converters, such as buck converters, boost converters, and other converter types, often use control circuitry and techniques to control a level of one or more signals of the converters (e.g., voltage output signals). The control circuitry can be implemented with digital and/or analog circuitry and techniques. In digital control, control signals generated by feedback and/or feedforward control circuitry of a converter may be used to generate a duty cycle word indicative of a required duty cycle for generating a desired converter output voltage. The duty cycle word may be converted into a voltage control signal for controlling a power stage of the converter from which the converter output voltage is generated.

Compensation circuitry and techniques for the digital control loop are generally tailored to a particular set of operating conditions. For example, control parameters such as loop bandwidth and crossover frequency may be selected based on a desired operating frequency and converter output voltage. If operating conditions change, it may be necessary to set new parameter values.

SUMMARY

Described herein are concepts, systems, circuits and techniques related to a control circuit for a voltage regulator including a digital compensator configured to perform adaptive compensation to permit operation over different operating conditions. In one aspect of the concepts described herein, the digital compensator includes a gain parameter that is inversely proportional to the input voltage and is independent of the switching frequency. The regulator includes at least one switch responsive to a voltage control signal for switching at a switching frequency and an output filter having a corner frequency, the voltage regulator configured to convert an input voltage into a regulated output voltage. The regulator further includes a divider coupled to the regulated output voltage to generate a divided voltage having a value that is a fraction of the regulated output voltage, an ADC responsive to the divided voltage to generate a feedback control signal, and the digital compensator. The compensator is responsive to the feedback control signal to generate a compensator signal and a pulse width modulator is responsive to the compensator signal to generate the voltage control signal. An error amplifier may be responsive to the divided voltage and to a reference voltage to generate an error voltage for coupling to the ADC.

The control circuit may include one or more of the following features individually or in combination with other features. The voltage regulator has a crossover frequency established by at least one pole and at least one zero and the corner frequency of the output filter has a first fixed, predetermined relationship with respect to the switching frequency, a second fixed, predetermined relationship with respect to the crossover frequency, and a third fixed, predetermined relationship with respect to the at least one pole and at least one zero. The digital compensator may include a Proportional-Integral-Derivative (PID) controller with an integral register configured to store a value indicative of the input voltage. A proportional gain, integral gain, or derivative gain of the PID controller may be scaled by the value indicative of the input voltage. The digital compensator may be configured to generate the compensator signal during a first portion of cycles of a system clock signal and the gain of the digital compensator may be scaled by the value indicative of the input voltage during a second portion of clock cycles different than the first portion of cycles of the system clock signal. In embodiments, the digital compensator may be further responsive to a feedforward signal indicative of a variation in the input voltage. The voltage regulator may be a DC-DC converter, such as a buck regulator.

Also described is a method for generating a voltage control signal for controlling a switch of a voltage regulator configured to convert an input voltage into a regulated output voltage, the switch operating at a switching frequency and the voltage regulator further comprising an output filter having a corner frequency, including generating a feedback control signal based on a voltage difference between the regulated output voltage and a reference voltage, generating a duty cycle word with a digital compensator in response to the feedback control signal, comprising computing a compensator gain that is independent of the switching frequency, and converting the duty cycle word into the voltage control signal with a pulse width modulator.

The method for generating a control voltage may include one or more of the following features individually or in combination with other features. The voltage regulator has a crossover frequency established by at least one pole and at least one zero and, in embodiments, the method includes setting the corner frequency of the output filter to have a first fixed, predetermined relationship with respect to the switching frequency, a second, fixed predetermined relationship with respect to the crossover frequency, and a third fixed, predetermined relationship with respect to the at least one pole and at least one zero. Generating the duty cycle word may include providing a digital compensator with a proportional-Integral-Derivative (PID) controller. Providing the digital compensator with a PID controller may include providing an integral register in which a value indicative of the input voltage is stored and computing the compensator gain may include scaling one or more of a proportional gain, an integral gain, or a derivative gain of the PID controller by the value indicative of the input voltage. Generating the duty cycle word may include generating the duty cycle word in response to the feedback control signal and to a feedforward signal. Generating the feedback control signal may include dividing the regulated output voltage to generate a divided voltage having a value that is a fraction of the regulated output voltage, generating an error voltage indicative of a difference between the divided voltage and the reference voltage, and converting the error voltage into a digital signal to generate the feedback control signal.

In a further aspect of the concepts described herein, a control circuit is provided for a voltage regulator including at least one switch responsive to a voltage control signal for switching at a switching frequency and an output filter having a corner frequency, the voltage regulator having a crossover frequency established by at least one pole and at least one zero and configured to convert an input voltage into a regulated output voltage. The control circuit includes a divider coupled to the regulated output voltage to generate a divided voltage having a value that is a fraction of the regulated output voltage, an error amplifier responsive to the divided voltage and to a reference voltage to generate an error voltage indicative of a difference between the divided voltage and the reference voltage, an ADC responsive to the error voltage to generate a feedback control signal, a digital compensator responsive to the feedback control signal to generate a compensator signal, and a pulse width modulator responsive to the compensator signal to generate the voltage control signal. The corner frequency of the output filter has a first fixed, predetermined relationship with respect to the switching frequency, a second fixed, predetermined relationship with respect to the crossover frequency, and a third fixed, predetermined relationship with respect to the at least one pole and at least one zero.

The control circuit may include one or more of the following features individually or in combination with other features. The digital compensator may include a PID controller having an integral register configured to store a value indicative of the input voltage. One or more of a proportional gain, an integral gain, or a derivative gain of the PID controller may be scaled by the value indicative of the input voltage.

Also described is a control circuit for a voltage regulator having at least one switch responsive to a PWM voltage control signal for switching at a switching frequency and an output filter having a corner frequency, the voltage regulator configured to convert an input voltage into a regulated output voltage. The control circuit includes means for dividing the input voltage to generate a divided voltage having a value that is a fraction of the input voltage, means for generating an error signal indicative of a difference between the divided voltage and a reference voltage, means for converting the error voltage into a digital feedback control signal, means responsive to the digital feedback control signal and comprising a gain parameter that is inversely proportional to the input voltage and is independent of the switching frequency for generating a compensator signal indicative of a duty cycle for the switch, and means for generating the PWM voltage control signal in response to the compensator signal.

The control circuit may include one or more of the following features individually or in combination with other features. The voltage regulator has a crossover frequency established by at least one pole and at least one zero and, in embodiments, the corner frequency of the output filter has a first fixed, predetermined relationship with respect to the switching frequency, a second fixed, predetermined relationship with respect to the crossover frequency, and a third fixed, predetermined relationship with respect to the at least one pole and at least one zero. The compensator signal generating means may include a PID controller having an integral register configured to store a value indicative of the input voltage. One or more of a proportional gain, an integral gain, or a derivative gain of the PID controller may be scaled by the value indicative of the input voltage.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
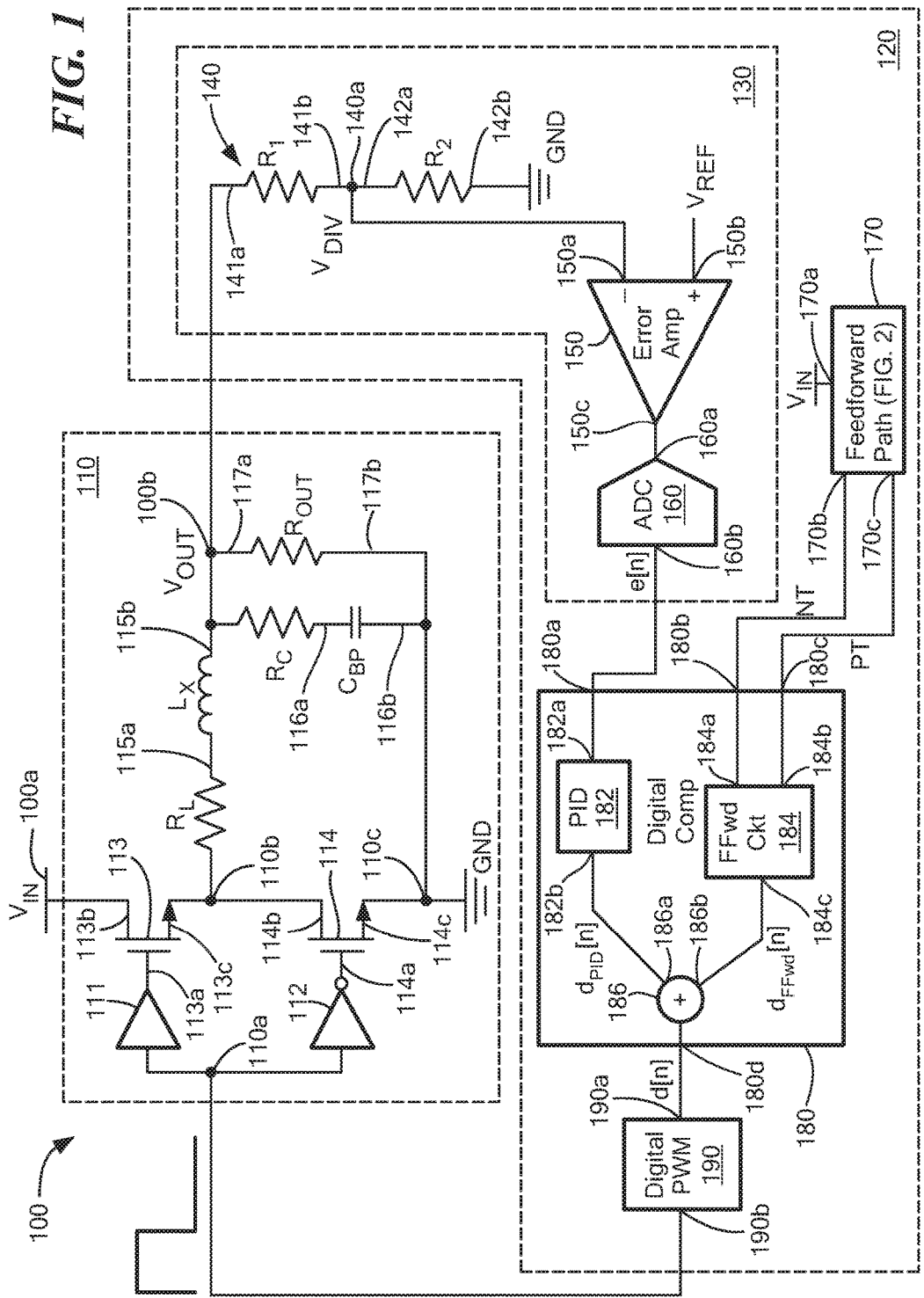
FIG. 1 is a block diagram of an example regulator circuit that includes a control circuit for generating a feedforward control signal and including a digital compensator with adaptive compensation.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views.

Referring now to FIG. 1, a simplified view of an example buck regulator circuit 100 which may be provided in a power management integrated circuit (IC), for example, is shown. The regulator circuit 100 (e.g., a voltage mode regulator) includes a power stage 110 and a control circuit 120 and has an input 100a at which an input or supply voltage $V_{IN}$ is received and an output 100b at which a regulated output voltage $V_{OUT}$ (e.g., a "stepped-down" output voltage) is generated.

The power stage 110, which is illustrative of one example configuration of a regulator power stage, includes a buffer 111, an inverter 112, a first transistor 113 (e.g., a first power switch) and a second transistor 114 (e.g., a second power switch). The power stage 110 also includes an output resistor $R_{out}$ and output filter (e.g., an LC filter) including an inductor $L_x$ and a capacitor $C_{BP}$. The inductor $L_x$ has a DC resistance $R_L$ and the capacitor $C_{BP}$ has an equivalent series resistance $R_c$, which are shown in the figure. In embodiments in which the buck regulator circuit 100 is provided in the form of an IC, it will be appreciated that various components may be integrated into the IC or may be external to the IC.

Transistors 113, 114 (e.g., field effect transistors (FETs)) are provided in a push-pull configuration in the illustrated embodiment, each having a corresponding first terminal 113a, 114a (e.g., a gate terminal) coupled to a node 110a (here, a control node) of power stage 110 at which a voltage control signal for controlling a voltage level of the output voltage $V_{OUT}$ is provided. The first terminals 113a, 114a of transistors 113, 114 are coupled to the node 110a via buffer 111 and inverter 112, respectively. Transistor 113 has a second terminal 113b (e.g., a drain terminal) coupled to regulator input 100a at which the input voltage or supply voltage $V_{IN}$ is provided and a third terminal 113c (e.g., a source terminal) coupled to a node 110b of power stage 110. Additionally, transistor 114 also has a second terminal 114b (e.g., a drain terminal) coupled to node 110b and a third terminal 114c (e.g., a source terminal) coupled to a node 110c of power stage 110, which node is coupled to a reference potential (here, GND).

Inductor $L_x$ has a first terminal 115a coupled to the node 110b and a second terminal 115b coupled to output voltage $V_{OUT}$ node 100b of power stage 110. Additionally, capacitor $C_{BP}$ has a first terminal 116a coupled to output node 100b and a second terminal coupled to node 110c of power stage 110, which node is coupled to GND. Further, output resistor $R_{out}$ has a first terminal 117a coupled to node 100b and a second terminal 117b coupled to GND node 110c.

The control circuit 120 (e.g., a voltage mode control circuit), which generates the voltage control signal received at node 110a of the power stage 110, as will be discussed further below, includes a feedback path 130 and a feedforward path 170. The control circuit 120 also includes a compensator 180 coupled to the feedback path 130 and to the feedforward path 170 and a digital Pulse Width Modulator (PWM) 190 coupled to the digital compensator 180.

The feedback path 130 includes a divider circuit 140, an error amplifier 150 and an analog-to-digital converter (ADC) 160. The divider 140 is coupled to regulator output 100b and includes a first resistor $R_1$ and a second resistor $R_2$. Resistor $R_1$ has a first terminal 141a coupled to the regulator output 100b and a second terminal 141b coupled to a node 140a (i.e., an intermediate node) of the divider circuit 140 at which a divided voltage $V_{DIV}$ is provided. The divided voltage $V_{DIV}$ has a value that is a fraction of the output voltage $V_{OUT}$ at the regulator output 100b. Resistor $R_2$ of the divider 140 has a first terminal 142a coupled to node 140a and a second terminal 142b coupled to a reference potential (here, GND).

The error amplifier 150 of the feedback path 130 is coupled to receive the divided voltage $V_{DIV}$ at a first input 150a (e.g., an inverting input) and a reference voltage $V_{REF}$ at a second input 150b (e.g., a non-inverting input) and is configured to generate an error voltage at an output 150c in response to a difference between the first amplifier input 150a and the second amplifier input 150b. Additionally, the ADC 160 of the feedback path 130 is coupled to receive the error voltage at an ADC input 160a and is configured to generate a converted digital signal (e.g., a binary word) e[n] at an ADC output 160b in response to the ADC input 160a. The converted digital signal e[n] corresponds to a feedback control signal of the feedback path 130 in the illustrated embodiment. It will be appreciated that in some embodiments, the error amplifier 150 and/or the resistor divider 140 may be eliminated in which case the output voltage or divided version thereof may be directly coupled to the ADC 160.

The feedforward path 170 of the control circuit 120, which may be referred to herein alternatively as the feedforward control circuit or simply control circuit 170, has a feedforward path input 170a coupled to the input voltage $V_{IN}$ received at input 100a of the regulator circuit 100. The feedforward path 170 is configured to generate a first feedforward signal PT indicative of a positive transient of the input voltage $V_{IN}$ at a first feedforward path output 170b in response to the feedforward path 170 detecting that the input voltage $V_{IN}$ experiences a positive transient (i.e., a voltage increase). Additionally, the feedforward path 170 is configured to generate a second feedforward signal NT indicative of a negative transient of the input voltage $V_{IN}$ at a second feedforward path output 170c in response to the feedforward path 170 detecting that the input voltage $V_{IN}$ experiences a negative transient (i.e., a voltage decrease).

The compensator 180 (e.g., a digital compensator) of the control circuit 120 is coupled to receive the feedback control signal e[n] at a first compensator input 180a. Additionally, the compensator 180 is coupled to receive the first feedforward signal PT at a second compensator input 180b when the feedforward path 170 detects that the input voltage $V_{IN}$ experiences a positive transient and to receive the second feedforward signal NT at a third compensator input 180c when the feedforward path 170 detects that the input voltage $V_{IN}$ experiences a negative transient. The compensator 180 is configured to generate a duty cycle word d[n] at a compensator output 180d in response to the compensator inputs 180a, 180b, and 180c. In general, the first feedforward signal PT will tend to cause the compensator output duty cycle word d[n] to reduce the duty cycle of the switches 113, 114 (in response to a positive input voltage variation or transient) and the second feedforward signal NT will tend to cause the compensator output duty cycle word d[n] to increase the duty cycle of the switches 113, 114 (in response to a negative input voltage variation or transient).

More particularly, in the illustrated embodiment the compensator 180 includes a proportional-integral-derivative (PID) controller 182, a feedforward duty cycle circuit 184 and a compensator output module 186. The PID controller 182 is coupled to receive the feedback control signal e[n] from the first compensator input 180a at a PID controller input 182a and is configured to generate a first duty cycle word $d_{PID}[n]$ associated with the feedback control signal e[n] at a PID controller output 182b. Additionally, the feedforward duty cycle circuit 184 is coupled to receive the first feedforward signal PT and the second feedforward signal NT from the second and third compensator inputs 180b, 180c at first and second feedforward circuit inputs 184a, 184b, respectively, and is configured to generate a second duty cycle word $d_{FFwd}[n]$ associated with the received first or second feedforward signals at a feedforward circuit output 184c. Further, the compensator output module 186, which includes a summing circuit in the illustrated embodiment and may include a subtractor circuit in other embodiments, for example, is coupled to receive the first duty cycle word $d_{PID}[n]$ at a first compensator output module input 186a and the second duty cycle word $d_{FFwd}[n]$ at a second compensator output module input 186b and is configured to generate a third duty cycle word d[n] as a combination of the first and second duty cycle words $d_{PID}[n]$, $d_{FFwd}[n]$. The third duty cycle word d[n] is provided to the compensator output 180d.

In some embodiments, the PID controller 182 may contain fixed, constant gain parameters for the proportional, integral, and derivative components. In other embodiments however, according to a further aspect described below in connection with FIGS. 4 and 5, the PID controller 182 may be configured to perform adaptive compensation by mathematically computing adaptive gain parameters for use in order to thereby permit stable operation for different operating conditions.

The digital PWM circuit 190 of the control circuit 120 is coupled to receive the duty cycle word d[n] (i.e., the third duty cycle word d[n]) generated by the compensator 180 at a PWM input 190a and is configured to generate a PWM, or voltage control signal at a PWM output 190b. The voltage control signal has a duty cycle based on the duty cycle word d[n].

Transistors 113, 114 of power stage 110 are each coupled to receive the voltage control signal or an inverted version of the voltage control signal at a corresponding input 113a, 114a and are switched on and off (i.e., between conducting and non-conducting states) in response to transitions of the voltage control signal. More particularly, power stage 110 is coupled to receive the voltage control signal at node 110a and is configured to generate two complementary transistor drive signals for controlling transistors 113, 114. It will be understood that the first and second transistor drive signals may be level shifted with respect to the voltage control signal at node 110a and may be processed to introduce a dead time during which neither transistor 113, 114 is on.

Figure 2:
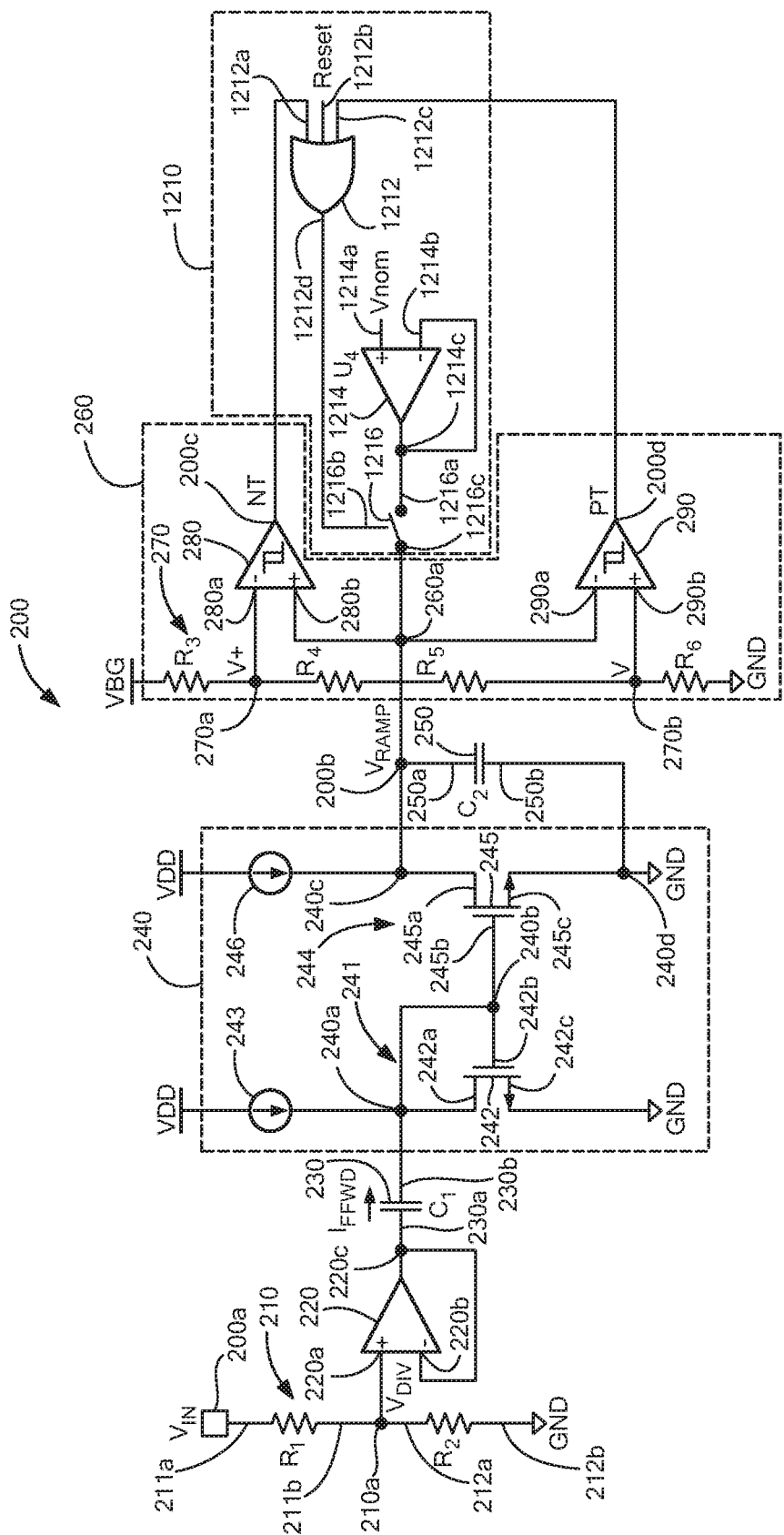
FIG. 2 is a block diagram of an example feedforward control circuit of the regulator circuit of FIG. 1.

Referring now to FIG. 2, an example feedforward control circuit 200 for generating a feedforward control signal according to an embodiment of the disclosure is shown. The control circuit 200, which may provide the feedforward path 170 in the regulator circuit 100 of FIG. 1, includes a first divider 210, a first buffer 220, a first capacitor 230, a current mirror circuit 240 and a digitizing circuit 260 from which the feedforward control signal is generated. More particularly, the control circuit 200 receives an input voltage $V_{IN}$ that may be the same or similar to input voltage $V_{IN}$ of FIG. 1 at an input 200a of the control circuit 200 and generates a feedforward control signal based on the input voltage $V_{IN}$. In the example circuit 200, the feedforward control signal may take the form of a first control signal NT provided at a first feedforward output 200c and/or a second control signal PT provided at a second feedforward output 200d of the control circuit 200.

The first divider 210 of the control circuit 200 includes a first resistor $R_1$ and a second resistor $R_2$. Resistor $R_1$ has a first terminal 211a coupled to the input voltage $V_{IN}$ and a second terminal 211b coupled to a node 210a (i.e., an intermediate node) of the divider 210 at which a divided voltage $V_{DIV}$ having a value that is a fraction of the input voltage $V_{IN}$ is generated. Additionally, resistor $R_2$ has a first terminal 212a coupled to node 210a and a second terminal 212b coupled to a reference potential (here, ground or GND). Resistance values of the resistors $R_1$, $R_2$ may be selected to achieve a desired divided voltage $V_{DIV}$, which divided voltage $V_{DIV}$ is coupled to the first buffer 220. In particular, resistance values of the resistors $R_1$, $R_2$ may be selected to divide the input voltage $V_{IN}$ by an amount sufficient to allow lower voltage rated components to be used in the control circuit 200, particularly in applications in which the input voltage $V_{IN}$ can vary significantly, such as in automotive applications in which the input voltage can vary between about 10V and 60V. Resistors $R_1$ and $R_2$ may be selected to have relatively large resistance values in order to reduce static current drawn from the input voltage $V_{IN}$.

The first buffer 220 may be a unity gain buffer configured to provide a buffered voltage at a buffer output 220c in response to the divided voltage $V_{DIV}$. The first capacitor 230 has a first terminal coupled to the buffer output 220c and a second terminal 230b, and a feedforward current $I_{FFWD}$ flows through capacitor 230 when there is a variation (i.e., a positive or negative transient) in the input voltage $V_{IN}$. More particularly, as will be described, under relatively steady state input voltage conditions there will be no current flow through capacitor 230 because there is no voltage drop across its terminals 230a, 230b. However, when the input voltage $V_{IN}$ varies by more than a predetermined amount (i.e., experiences a predetermined positive or negative variation, referred to herein alternatively as the occurrence of a positive or negative input voltage transient), then current $I_{FFWD}$ is generated. More particularly, if the input voltage transient is positive (i.e., the input voltage rises), then the feedforward current $I_{FFWD}$ flows from the buffer output 220c to the current mirror circuit 240; whereas if the input voltage transient is negative (i.e., the input voltage falls), then the feedforward current $I_{FFWD}$ flows from the current mirror circuit 240 to the buffer output 220c. Buffer 220 separates resistors $R_1$ and $R_2$ from capacitor 230, thereby advantageously reducing the time constant associated with the feedforward current $I_{FFWD}$.

The current mirror circuit 240 has a first current path 241 coupled to the second capacitor terminal 230b and to a first reference current source 243 and a second current path 244 coupled to a second reference current source 246. Additionally, the current mirror circuit 240 has a current mirror output node 240c at which a current mirror output voltage ($V_{RAMP}$) indicative of the input voltage variation is generated. In embodiments, the first reference current source 243 and the second reference current source 246 are a same reference current source (i.e., the first current path and the second current path are coupled to a same current source), or at least provide substantially the same current level.

In the illustrated embodiment, the first current path 241 includes a first transistor 242 and the second current path 244 includes a second transistor 245. First transistor 242 (e.g., a FET) of the first current path 241 has a first terminal 242a (e.g., a source terminal) coupled a node 240a of the current mirror circuit 240, which node 240a is coupled to the second terminal 230b of the first capacitor 230 and to the first reference current source 243. First transistor 242 also has a second, control terminal 242b (e.g., a gate terminal) coupled to a node 240b of the current mirror circuit 240, which node 240b is coupled to node 240a of the current mirror circuit 240. Additionally, first transistor 242 has a third terminal 242c (e.g., a drain terminal) coupled a reference potential (here, GND).

Second transistor 245 (e.g., a FET) of the second current path 244 has a first terminal 245a (e.g., a source terminal) coupled to a node 240c of the current mirror circuit 240 at which a current mirror output voltage indicative of a variation of the input voltage $V_{IN}$ is generated, and coupled to the second reference current source 246. Additionally, second transistor 245 has a second, control terminal 245b (e.g., a gate terminal) coupled to node 240b and a third terminal 245c (e.g., a drain terminal) coupled to the reference potential.

A second capacitor 250 has a first terminal 250a coupled to a node 200b of the control circuit 200, which node 200b is coupled to node 240c of the second current path at which the current mirror output voltage is generated. The second capacitor 250 also has a second terminal 250b coupled to a reference potential, here GND. The current mirror output voltage is generated across the second capacitor 250.

In operation, if no feedforward current $I_{FFWD}$ flows (i.e., as will occur when the input voltage level $V_{IN}$ is relatively constant), then the same current provided by both of the current sources 243, 246 flows through the first and second current mirror circuit paths 241, 244. As a result, the voltage at nodes 240a and 240c will remain unchanged. If however, a positive input voltage transient occurs, causing a feedforward current $I_{FFWD}$ to flow into current mirror node 240a, then the voltage at node 240a will rise and the voltage at current mirror output node 240c will fall accordingly. The falling voltage at current mirror output node 240c discharges the capacitor 250 causing the voltage across capacitor 250 to fall and this decrease in the current mirror output voltage $V_{RAMP}$ will be sensed by the digitizing circuit 260 to provide an indication of the positive input voltage transient via the feedforward control signal PT. Conversely, if a negative input voltage transient occurs causing a feedforward current $I_{FFWD}$ to flow out of current mirror node 240a to the buffer output 220c, then the voltage at node 240a will fall and the voltage at current mirror output node 240c will rise accordingly. The rising voltage at current mirror output node 240c causes the capacitor 250 to charge and this increase in the current mirror output voltage $V_{RAMP}$ will be sensed by the digitizing circuit 260 to provide an indication of the negative input voltage transient via the feedforward control signal NT. With the above explanation, it will be apparent that the same current that flows through capacitor 230 flows through capacitor 250, but with opposition polarity.

In embodiments, the first capacitor 230 has a first capacitance value and the second capacitor 250 has a second capacitance value that is substantially different from the first capacitance value. In embodiments, the first and second capacitance values are selected such that the current mirror output voltage generated at nodes 240c, 200b changes at a substantially same rate as the input voltage $V_{IN}$. More particularly, since an equal but opposite polarity current flows through capacitor 250 as flows through capacitor 230, and since both capacitors 230, 250 are affected by the same rate of change of the input voltage $dV_{IN}/dt$, the rate of change of the voltage across both capacitors will be the same (albeit the rate of change of the voltage across capacitor 230 will be $+dV_{IN}/dt$ and the rate of change of the voltage across capacitor 250 will be $-dV_{IN}/dt$). As one of various examples, capacitor 230 may have a capacitance value of 50 pF and capacitor 250 may have a capacitance value of 5 pF.

The digitizing circuit 260, which is illustrative of one example configuration of a digitizing circuit according to the disclosure, includes a second divider 270, a first comparator 280 and a second comparator 290.

The second divider 270 of the digitizing circuit 260 includes a resistor ladder having a plurality of series-coupled resistors (here, resistors $R_3$, $R_4$, $R_5$, $R_6$). The divider 270 is coupled between a bandgap reference voltage $V_{BG}$ and a reference potential, such as GND and has intermediate nodes 270a, 270b at which reference, or threshold voltages V+, V− are provided, respectively.

In some embodiments, the first threshold voltage V+ has a first voltage value and the second threshold voltage V− has a second voltage value that is different from the first voltage value. In other embodiments, the first voltage value of the first threshold voltage V+ is substantially similar to the second voltage value of the second threshold voltage V−. The first and second threshold voltages V+, V− establish the negative and positive input voltage variations at which the feedforward control signal (or more particular, respective feedforward control signals NT, PT) transitions to indicate a negative or positive input voltage variation, respectively.

The first comparator 280 is coupled to current mirror output node 240c (e.g., a level-shifted voltage) at a first comparator input (e.g., a non-inverting input) and is also coupled to receive the first threshold voltage V+ at a second comparator input (e.g., an inverting input) and is configured to generate a first comparison signal NT at an output 200c. The first comparison signal NT, which corresponds to a first feedforward control signal, may be indicative of a negative transient of the input voltage $V_{IN}$ when the current mirror output voltage is less than the first threshold voltage.

The second comparator 290 is coupled to the current mirror output node 240c at a first comparator input (e.g., an inverting input) and is also coupled to receive the second threshold voltage V− at a second comparator input (e.g., a non-inverting input) and is configured to generate a second comparison signal PT at an output 200d. The second comparison signal PT, which corresponds to a second feedforward control signal, may be indicative of a positive transient of the input voltage $V_{IN}$ when the current mirror output voltage is greater than the second threshold voltage.

In operation, when a positive input voltage transient occurs, causing a feedforward current $I_{FFWD}$ to flow into current mirror node 240a and the voltage at node 240a to rise, the current mirror output voltage $V_{RAMP}$ will fall and when $V_{RAMP}$ hits the threshold voltage V−, the output 200d of comparator 290 will trip generating logic bit PT to indicate the positive input voltage transient. Conversely, when a negative input voltage transient occurs, causing a feedforward current $I_{FFWD}$ to flow out of current mirror node 240a and the voltage at node 240a to fall, the current mirror output voltage $V_{RAMP}$ will rise and when $V_{RAMP}$ hits the threshold voltage V+, the output 200c of comparator 280 will trip generating logic bit NT to indicate the negative input voltage transient.

Mismatches between the first and second current mirror paths 241, 244 may lead to drift in the current mirror output voltage $V_{RAMP}$ over time. Accordingly, control circuit 200 may include a reset circuit 1210 to counteract this issue. The reset circuit 1210, which is illustrative of one example configuration of a reset circuit, includes a logic gate 1212, a second buffer 1214 and a switch 1216.

The logic gate 1212 is coupled to receive the first comparison signal NT at a first logic gate input 1212a, the second comparison signal PT at a second logic gate input 1212c, and a reset signal at a third logic gate input 1212b and is configured to generate an output signal at logic gate, which signal is used to control operation of the switch 1216, as will be further discussed below.

Switch 1216 is coupled between the current mirror output 240c and an output of buffer 1214, as shown. The buffer 1214 is coupled to receive a third threshold voltage Vnom and is configured to reset the current mirror output voltage at node 240c to the threshold voltage Vnom when switch 1216 is closed.

The reset circuit 1210 is configured to periodically reset the current mirror output voltage at node 240c to a predetermined level, here Vnom. In one example configuration, the switch 1216 is closed to reset the current mirror output voltage after a predetermined number of cycles of a system clock signal (in response to the Reset signal) and also after the occurrence of positive logic bits PT and negative logic bits NT by operation of the OR gate 1212. Example operation of a control circuit according to the disclosure (e.g., 200, shown in FIG. 2) and the reset functionality is described further below in connection with FIG. 3. As will be apparent, because the current mirror output voltage level $V_{RAMP}$ is reset at periodic intervals, certain, relatively slower input voltage variations may not be detected since the voltage on capacitor 250 may not be able to reach the threshold voltage V+ and V− before it is reset to Vnom. However, generally, the feedback path 130 (FIG. 1) is designed to detect such slower input voltage transients.

It is to be appreciated that the feedforward control circuit 200 described above is but one of many potential configurations of feedforward control circuits in accordance with the concepts, systems, circuits and techniques described herein. As one example, while the digitizing circuit 260 of the control circuit 200 is shown and described herein as including first and second comparators 280, 290 to generate respective comparison signals indicative of negative and positive transients of the input voltage $V_{IN}$, respectively, in some embodiments the digitizing circuit 260 can alternatively include more than two comparators and/or other circuitry (e.g., multi-bin ADCs), for example, to detect more subtle changes in the input voltage $V_{IN}$ (and the current mirror output voltage $V_{RAMP}$ to which the digitizing circuit 260 is responsive).

Figure 3:
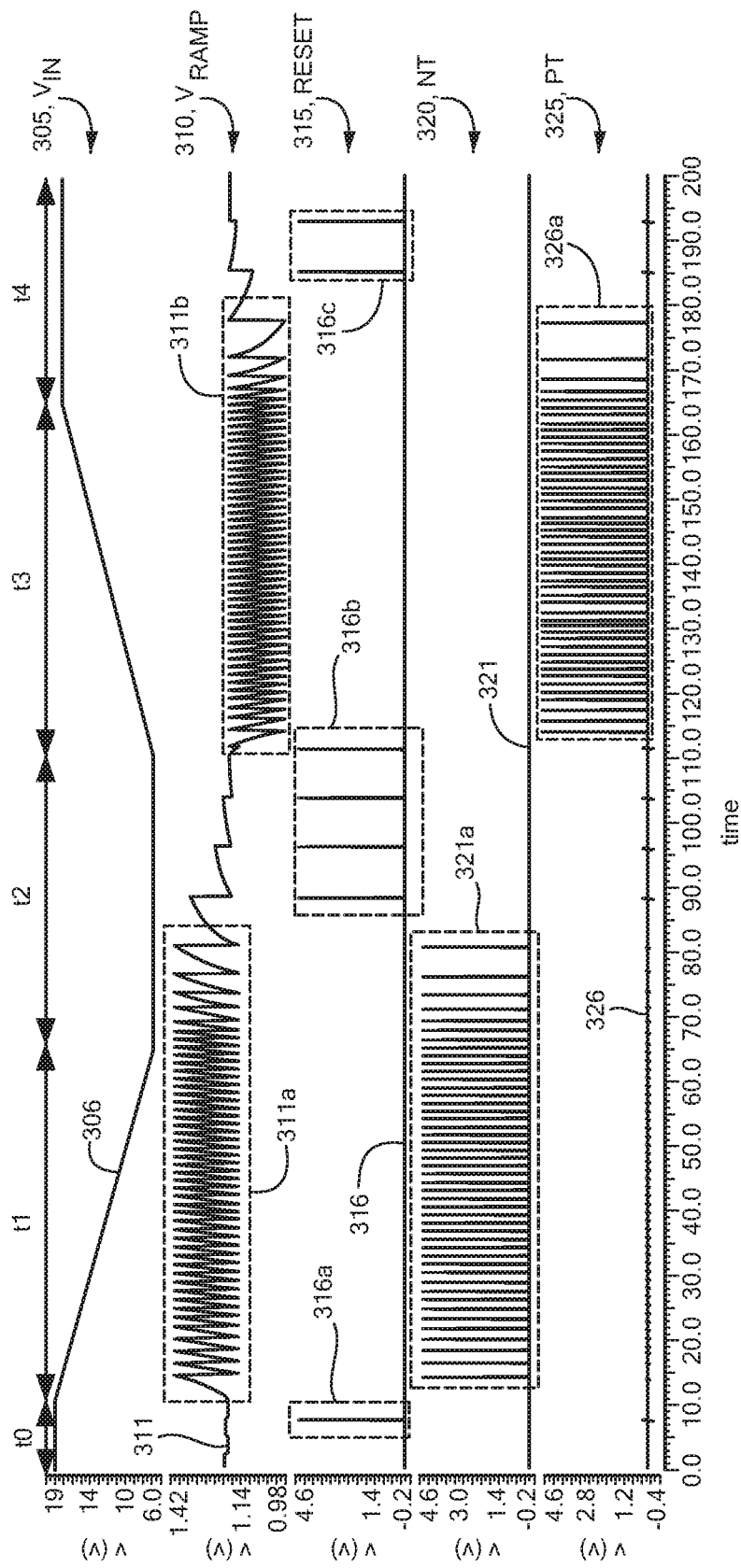
FIG. 3 shows illustrative signal waveforms of various example input and output signals of the control circuit of FIG. 2.

Referring to FIG. 3, illustrative signal waveforms of various input and output signals of a control circuit, which can be the same as or similar to feedforward control circuit 200 shown in FIG. 2, are shown in a plurality of plots (305, 310, 315, 320, 325) having a horizontal axis with a scale in time units and a vertical axis with a scale in units of volts (V). Plot 305 includes a signal 306 representative of input voltage $V_{IN}$ and plot 310 includes a signal 311 representative of a current mirror output voltage $V_{RAMP}$ as may be generated at a current mirror output node (e.g., node 240c, shown in FIG. 2). Plot 315 includes a signal 316 representative of a reset signal as may be provided to an input 1212b of logic gate 1212 (FIG. 2) of the control circuit, plot 320 includes a signal 321 representative of a feedforward control signal NT indicative of a negative transient of the input voltage $V_{IN}$, and plot 325 includes a signal 326 representative of a feedforward control signal PT indicative of a positive transient of the input voltage $V_{IN}$.

As illustrated, signal levels of the current mirror output voltage 311 vary in response to a signal level of the input voltage $V_{IN}$ signal 306. As is also illustrated, the current mirror output voltage 311 is periodically reset in response to the reset signal 316 when there are no input voltage transients present, shown in plot 315.

More particularly, during a first time period t0, the input voltage $V_{IN}$ signal 306 is at a first steady state voltage level (i.e., there is no transient). Since no feedforward current $I_{FFWD}$ flows through capacitor 230 under this steady state input voltage condition, current mirror output voltage 311 also remains substantially constant. Additionally, after a predetermined amount of time during the first time period t0 in which no transient in the input voltage $V_{IN}$ signal 306 is detected by the control circuit, a reset pulse 316a of the reset signal 316 resets the current mirror output voltage 311 to a predetermined level, such as $V_{nom}$ (FIG. 2).

During a second time period t1, the input voltage $V_{IN}$ signal 306 decreases from the first voltage level to a second voltage level that is substantially less the first voltage level. In response thereto, the current mirror output voltage 311 increases, causing the comparator 280 (FIG. 2) to trip and generate the negative transient signal 321 including a plurality of negative logic bits NT 321a indicative of the negative transient of the input voltage $V_{IN}$ 306. More particularly, each time the comparator 280 trips, generating an NT pulse or logic bit, the $V_{RAMP}$ voltage 311 is reset (via the NT input to logic gate 1212 of FIG. 2). It will be appreciated that the number of negative logic bits NT provides an indication of the magnitude of the negative input voltage transient.

During a third time period t2, the input voltage $V_{IN}$ signal 306 remains substantially constant, thereby resulting in no feedforward current flow $I_{FFWD}$ through capacitor 230 and no change in the voltage across capacitor 250 (i.e., $V_{RAMP}$). After a predetermined amount of time during the third time period t2 in which no transient in the input voltage $V_{IN}$ signal 306 is detected by the control circuit, reset pulses 316b of the reset signal 316 reset the current mirror output voltage 311 to a predetermined voltage level, such as $V_{nom}$ (FIG. 2).

During a fourth time period t3, the input voltage $V_{IN}$ signal 306 increases from the second voltage level to a third voltage level that is substantially greater than the second voltage level. In response thereto, current mirror output voltage 311 decreases, causing the comparator 290 (FIG. 2) to trip and generate the positive transient signal 326 including a plurality of positive logic bits PT 326a indicative of the positive transient of the input voltage $V_{IN}$ signal 306. More particularly, each time the comparator 290 trips, generating a PT pulse or logic bit, the $V_{RAMP}$ voltage 311 is reset (via the PT input to logic gate 1212 of FIG. 2). It will be appreciated that the number of positive logic bits PT provides an indication of the magnitude of the positive input voltage transient.

During a fifth time period t4, the input voltage $V_{IN}$ signal 306 remains substantially constant, again resulting in no feedforward current flow $I_{FFWD}$ through capacitor 230 and no change in the voltage across capacitor 250 (i.e., $V_{RAMP}$). Additionally, after a predetermined amount of time during the fifth time period t4 in which no transient in the input voltage $V_{IN}$ signal 306 is detected by the control circuit, reset pulses 316c of the reset signal 316 reset the current mirror output voltage 311 to a predetermined voltage level, such as $V_{nom}$ (FIG. 2).

Figure 4:
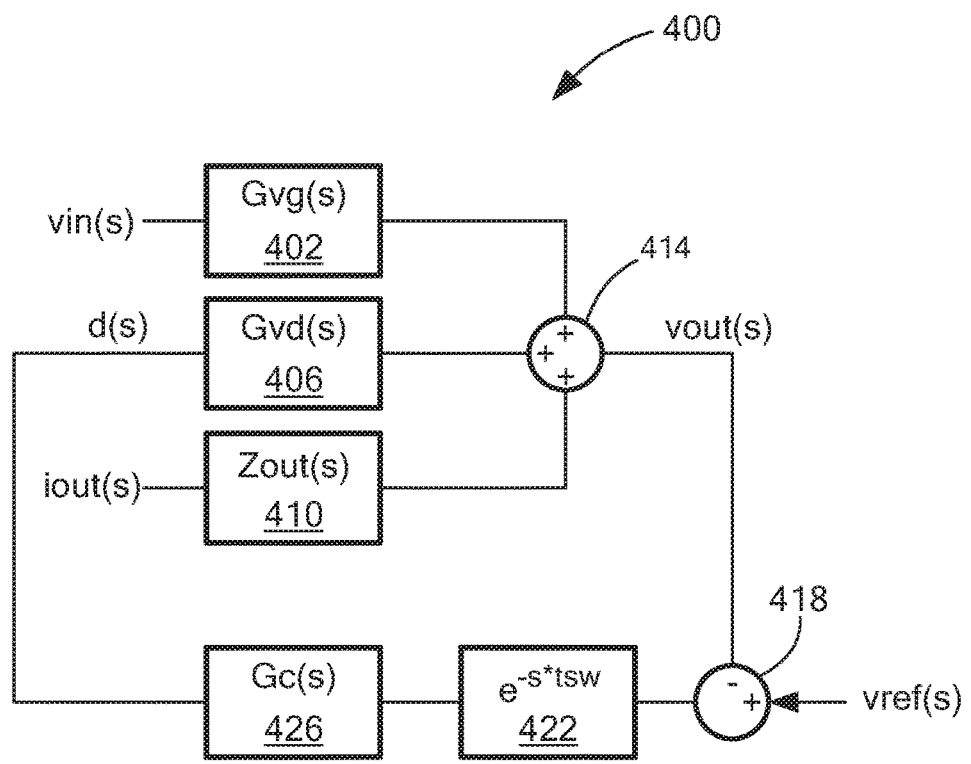
FIG. 4 shows a small signal control loop representation of a voltage mode buck converter including a digital compensator with adaptive compensation.

According to a further aspect, in embodiments, the PID controller 182 (FIG. 1) may contain an adaptive compensation feature. Referring to FIG. 4, a small signal control loop representation 400 of an embodiment of the Buck regulator 100 including a digital compensator with adaptive compensation is shown. The control loop 400 includes a control to output transfer function 406, Gvd(s), an input voltage to output transfer function 402, Gvg(s), and a term 410 representing the output impedance of the regulator Zout(s). A phase delay inherent to the digital control loop 400 is labelled 422, $e^{-st_{sw}}$ and the control loop 400 further includes a transfer function of the PID controller 426, Gc(s). The feedback division ratio (ratio associated with the feedback divider circuit 140 of FIG. 1) is assumed to be 1 for simplicity.

The control to output transfer function Gvd(s) given by equation (1):

$$Gvd = \frac{Vin}{\frac{s^2}{\omega_0^2} + \frac{s}{Q_{eff}\omega_0} + 1 + \frac{R_L}{R_{OUT}}} \quad (1)$$

contains two poles at the corner frequency $\omega_0$ of the LC output filter including inductor $L_x$ and a capacitor $C_{BP}$ (FIG. 1). The $Q_{eff}$ in the transfer function is given by $(Q_L \| Q_{OUT})$ where $$Q_L = \frac{1}{R_L}\sqrt{\frac{L_X}{C_{OUT}}} \text{ and } Q_{OUT} = R_{OUT}\sqrt{\frac{C_{OUT}}{L_X}}.$$

Thus, at light loads, the $Q_{eff}$ is dominated by $R_L$ which represents conduction losses in the circuit due inductor DC and AC resistance, MOSFET on resistance and other resistive losses. At heavy loads, the $Q_{eff}$ is dominated by low output resistance ($R_{OUT}$).

The PID transfer function 426 Gc(s) contains two zeros to compensate for the double poles of the control to output transfer function 406, Gvd(s), one pole at DC for infinite gain at DC, and another pole to keep the compensator bounded. The general form of a PID transfer function 426 Gc(s) is shown in equation (2), where $\omega_{z1}$ and $\omega_{z2}$ are the two zeros and $\omega_p$ is the pole.

$$Gc = \frac{K\left(\frac{s}{\omega_{z1}} + 1\right)\left(\frac{s}{\omega_{z2}} + 1\right)}{s\left(\frac{s}{\omega_p} + 1\right)} \quad (2)$$

To achieve adaptive compensation, several relationships between certain control loop parameters are established and maintained. In particular, the corner frequency $\omega_0$ of the output filter has a first fixed, predetermined relationship with respect to the switching frequency $\omega_{SW}$, a second fixed, predetermined relationship with respect to the crossover frequency $\omega_C$, and a third fixed, predetermined relationship with respect to the at least one pole $\omega_P$ and at least one zero $\omega_{Z1}$, $\omega_{Z2}$. One example set of such predetermined relationships is give in equation (3):

$$\omega_c = 5\omega_0 \quad (3)$$
$$\omega_{z1} = \frac{\omega_0}{10}$$
$$\omega_{z2} = \omega_0$$
$$\omega_p = 10\omega_0$$
$$\omega_{SW} = 100\omega_0$$

As will become apparent, the specific predetermined relationships (i.e., ratios) set forth in equation (3) can be varied to suit design requirements; however, once the relationships are fixed, the compensation parameters (i.e., proportional, integral, and derivative gain terms Kp, Ki, Kd, respectively, discussed below) will automatically vary, or adapt as output voltage $V_{OUT}$, switching frequency, and input voltage $V_{IN}$ are varied.

Using the relationships set forth in equation (3) above, the transfer function Gc(s) 426 of the PID controller (i.e., equation (2)) can be simplified as follows:

$$Gc = \frac{K\left(\frac{10s}{\omega_0} + 1\right)\left(\frac{s}{\omega_0 + 1}\right)}{s\left(\frac{s}{10\omega_0} + 1\right)} \quad (4)$$

The total loop gain of the converter is given by Gvd×Gc. At the crossover frequency $\omega_c$, the total loop gain is set to 1 and phase margin is given by: $\pi + \angle$ (Gvd (j $\omega_c$)×Gc (j $\omega_c$)). Since the crossover frequency $\omega_c$ is set at five times the output filter corner frequency $\omega_0$, the phase of the converter (i.e., $\angle$ (Gvd (s=j $\omega_c$)) can be estimated to be approximately −180° (presuming that the $Q_{eff}$ is not too high). More particularly, the phase of the converter Gvd (i.e., $\angle$ (Gvd (s=j $\omega_c$)) can be approximately given by $$\tan^{-1}\frac{5}{24Q_{eff}}.$$

Since this converter phase is very small for relatively small $Q_{eff}$, the phase margin of the system is simply the phase gain provided by compensator at the crossover frequency $\angle$ (Gc (s=j $\omega_c$); which by solving equation (4) is approximately 76°. Thus, for $Q_{eff}$>0.72, the phase of the compensator is approximately 76°. In case of $Q_{EFF}$<0.72, the phase margin would be higher than 76° because the phase lag due to double poles of LC filter would be less.

For the magnitude computation, it assumed that due to double poles at the LC corner frequency $\omega_o$, the control to output transfer function Gvd will drop by 40 dB/decade from the corner frequency. Hence, the magnitude of the transfer function Gvd (s=j $\omega_c$)~$V_{IN}$/25. It will be appreciated that this expression is based on the relationships of equation (3) and specifically based on having the crossover frequency at approximately five times the LC corner frequency.

Based on this same relationship of the crossover frequency being approximately five times the corner frequency and equation (5), it follows that the magnitude of the PID controller transfer function Gc (s=j $\omega_c$)=45.62×K/$\omega_0$.

Because it is desirable to keep the total loop gain (i.e., Gc×Gvd) approximately equal to one at the crossover frequency, it is desirable to maintain the following expression, from which K can be determined:

$$45.62\frac{K}{\omega_0}\frac{V_{IN}}{25} = 1 \quad (5)$$

From equation (5), it can be see that the compensator DC gain K is inversely proportional to the input voltage $V_{IN}$. This relationship forms the basis of the described adaptive compensation techniques. As illustrated below, for digital compensation, the proportional, integral and derivative parameters only depend on input voltage $V_{IN}$ and their relationship to switching frequency is eliminated due to the relationships set forth in equation (3).

Referring back to equation (4), in order to convert this analog compensator expression into the discrete domain, bilinear transformation $$\left(s \rightarrow \frac{2}{t_{sw}}\left(\frac{z-1}{z+1}\right)\right)$$

can be used which preserves the phase and gain matching between the analog and digital compensators up to half the switching frequency. Upon applying bilinear transformation, the discrete counterpart of Gc can be expressed by equation (6):

$$Gcd = \frac{Kt_{sw}}{2\pi}\frac{(10^3(z-1) + \pi(z+1))(10^2(z-1) + 2\pi(z+1))}{(z-1)(10(z-1) + \pi(z+1))} \quad (6)$$

$$Gcd = \frac{Kt_{sw}}{2\pi}\left(A_0 + \frac{A_1 z}{z-1} + A_2\frac{z-1}{z-\alpha}\right)$$

Substituting the value of K from equation (5), the discrete counterpart of Gc can be expressed by equation (7):

$$Gcd = \frac{1}{180.48V_{IN}}\left(A_0 + \frac{A_1 z}{z-1} + A_2 \frac{z-1}{z-\alpha}\right) \qquad (7)$$

Comparing equation (7) with the PID equation of a discrete compensator, it will be appreciated that the proportional compensator gain term Kp is given by $A_0/180.48V_{IN}$, the integral compensator gain term Ki is given by $A_1/180.48V_{IN}$, and the derivative compensator gain term Kd is given by $A_2/180.48V_{IN}$. Consideration of each of these compensator gain parameters reveals that the compensator gain is not dependent on switching frequency and is inversely proportional to input voltage $V_{IN}$. As a result, the same compensator parameters Kp, Ki, Kd can be used while the switching frequency is varied as long as the ratio between the corner frequency (fixed by proper selection of LC filter) and switching frequency is maintained.

Figure 5:
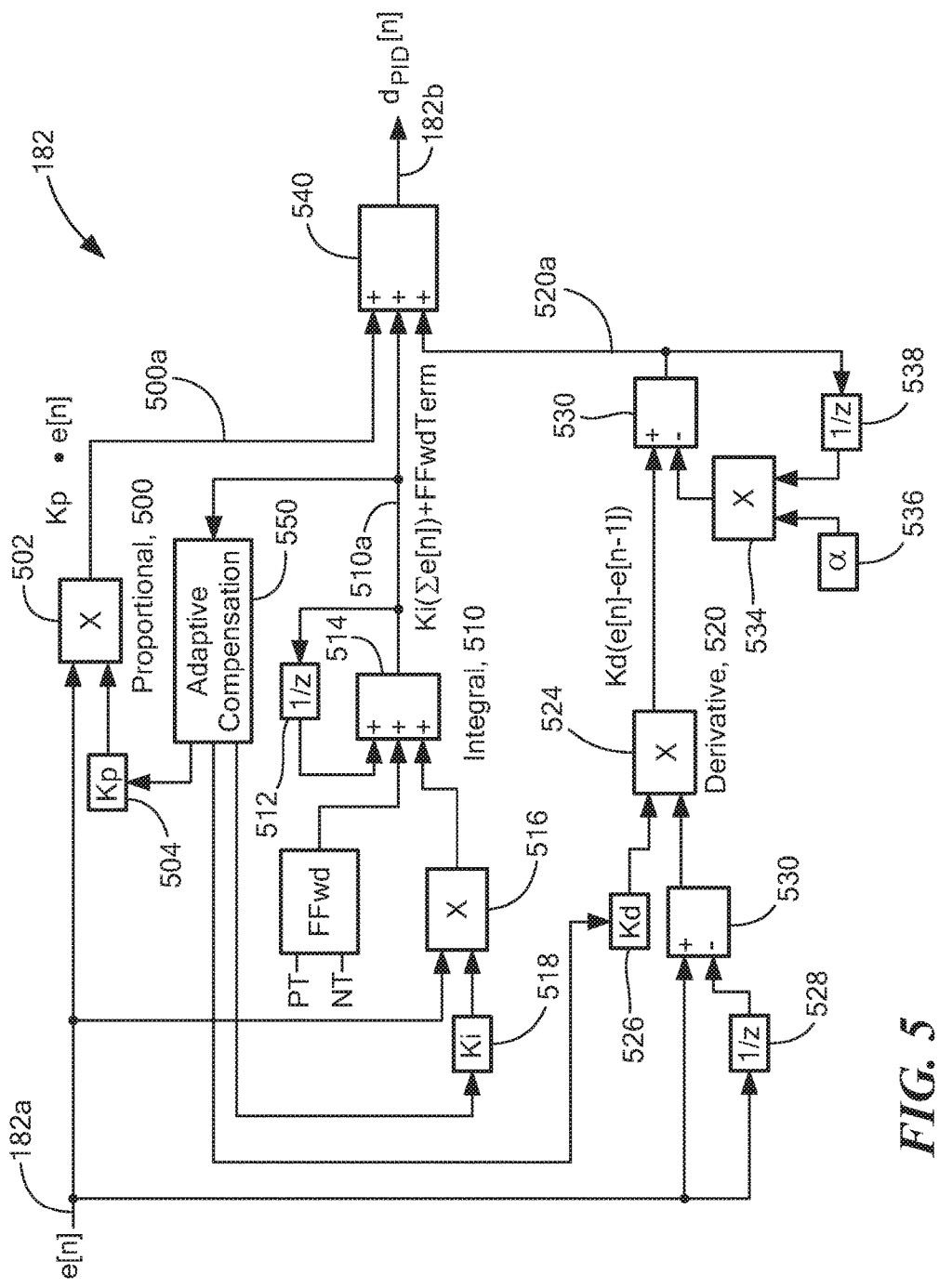
FIG. 5 is a block diagram of an example PID controller of the digital compensator of FIG. 1.

Referring also to FIG. 5, an example PID controller 182 implementing adaptive compensation is shown to receive the feedback control signal e[n] from the first compensator input 180a (FIG. 1) at a PID controller input 182a and is configured to generate a first duty cycle word $d_{PID}[n]$ associated with the feedback control signal e[n] at a PID controller output 182b. More particularly, the controller 182 includes a proportional portion 500, an integral portion 510 and a derivative portion 520. As will be explained, each of the controller portions 500, 510, 520 includes a respective gain term Kp, Ki, Kd stored in a respective register 504, 518, and 526, which gain terms are adaptively adjusted by an adaptive compensation unit 550 described below.

The proportional portion 500 includes a multiplier 502 configured to multiply a stored proportional gain Kp 504 by the feedback control signal e[n] to generate a proportional term 500a (Kp×e[n]) that is proportional to the error e[n]. The proportional term 500a is coupled to a summation element 540, as shown.

Integral portion 510 of the controller 182 includes a multiplier 516, the feedforward circuit 184 (FIG. 1) in embodiments in which feedforward control is implemented, an integrating or integral register 514, and a delay element 512. Multiplier 516 is configured to multiply the stored integral gain Ki 518 by the feedback control signal e[n]. Integrating register 514 is responsive to the duty cycle word $d_{FFwd}[n]$ associated with the received first or second feedforward signals. Thus, in some embodiments, the compensator module 186 (FIG. 1) may be part of the PID controller 182 in which case the duty cycle word $d_{FFwd}[n]$ may be coupled directly into the PID controller 182. The integral term 510a at the output of the integrating register 514 can be given by $Ki(\Sigma e[n])+d_{FFwd}[n]$ and is proportional to the integral of the error e[n]. The integral term 510a is coupled to the summation element 540. It will be appreciated that in embodiments not implementing feed forward control, the integral term is given simply by $Ki(\Sigma e[n])$.

The derivative portion 520 of the controller 182 includes a multiplier 524 configured to multiply the stored derivative gain Kd 526 by a difference between a current duty cycle error e[n] and a previous duty cycle error e[n−1] as generated by elements 528, 530. The output of the multiplier 524 can thus be expressed as Kd(e[n]−e[n−1]). Difference element 530 generates a derivative term 520a that is proportional to the derivative of the error e[n] by substracting the term Kd(e[n]−e[n−1]) from a previous value of the derivative term 520a multiplied by a gain a 536 as implemented with elements 534, 538.

Summation element 540 is responsive to the proportional term 500a, the integral term 510a, and the derivative term 520a to generate the duty cycle word $d_{PID}[n]$ associated with the feedback control signal e[n]. As noted above, PWM circuit 190 (FIG. 1) is configured to generate a PWM, or voltage control signal having a duty cycle based on the duty cycle word d[n].

The adaptive compensation unit 550 is responsive to the integral term 510a at the output of the integrating register 514 and generates and adaptively adjusts compensator gain parameters Kp 504, Ki 518, Kd 528. Advantageously, the integral term 510a holds information about the input voltage $V_{IN}$ because, even when the error term e[n] goes to zero, the integral term 510a keeps integrating the error value and so, holds the duty cycle associated with the input voltage. A relatively large duty cycle word in the integrating register 514 corresponds to a relatively small input voltage $V_{IN}$ and conversely, a smaller duty cycle word in the integrating register 514 corresponds a larger input voltage $V_{IN}$. This is especially true for a system where output voltage $V_{OUT}$ is fixed but other parameters like the switching frequency or input voltage $V_{IN}$ are varied.

In some applications, the output voltage $V_{OUT}$ (FIG. 1) may be changed by using a different resistance ratio for the feedback divider circuit 140 (FIG. 1). Significantly, in such embodiments in which the resistor divider ratio is varied to vary the output voltage $V_{OUT}$, the compensator gain parameters Kp 504, Ki 518, Kd 528 scale accordingly because the total loop gain includes the feedback divider circuit. Thus, even though a larger output voltage $V_{OUT}$ would generally require larger compensator gain parameters Kp 504, Ki 518, Kd 528 to achieve the same phase margin for the same crossover frequency, because the larger output voltage results in a larger duty cycle, this larger duty cycle is captured in the integrating register 514, which register value in turn proportionately scales the compensator gain parameters Kp 504, Ki 518, Kd 528. Furthermore, use of the integrating register value to scale the compensator gain parameters Kp 504, Ki 518, Kd 528 also captures variations in duty cycle attributable to input voltage $V_{IN}$ variations. Stated differently, a larger duty cycle would produce proportionally larger compensator gain parameters. A larger duty cycle is also indicative of smaller input and consequently larger compensator gain parameters. The adaptive compensation unit 550 that operates to scale the compensator gain parameters Kp 504, Ki 518, Kd 528 in a manner directly proportional to the stored duty cycle word thus adjusts the gain parameters in a manner that accounts for variations in feedback divider ratio implemented to vary the output voltage $V_{OUT}$ and also for variations in the input voltage $V_{IN}$. In embodiments, the adaptive compensation unit 550 can re-compute the compensator gain parameters Kp 504, Ki 518, Kd 528 in digital cycles when duty cycle computation is not being performed, thus adding little computational overheard to entire system.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above. For example, while the regulator 100 of FIG. 1 is described as including both the feedforward path and associated circuitry described further in connection with FIGS. 2 and 3 and also as including the adaptive compensation controller 182 described further in connection with FIGS. 4 and 5, it will be appreciated that regulators may benefit from incorporation of either of these features individually as well.

Accordingly, it is submitted that that scope of the patent should not be limited to the described embodiments but rather should be limited only by the spirit and scope of the following claims.

What is claimed is:

1. A control circuit for a voltage regulator comprising at least one switch responsive to a voltage control signal for switching at a switching frequency and an output filter having a corner frequency, the voltage regulator configured to convert an input voltage into a regulated output voltage, comprising:
    a divider coupled to the regulated output voltage to generate a divided voltage having a value that is a fraction of the regulated output voltage;
    an ADC responsive to the divided voltage to generate a feedback control signal;
    a digital compensator responsive to the feedback control signal to generate a compensator signal, wherein the digital compensator comprises a gain parameter that is inversely proportional to the input voltage and is independent of the switching frequency; and
    a pulse width modulator responsive to the compensator signal to generate the voltage control signal.

2. The control circuit of claim 1, wherein the voltage regulator has a crossover frequency established by at least one pole and at least one zero and wherein the corner frequency of the output filter has a first fixed, predetermined relationship with respect to the switching frequency, a second fixed, predetermined relationship with respect to the crossover frequency, and a third fixed, predetermined relationship with respect to the at least one pole and at least one zero.

3. The control circuit of claim 1, wherein the digital compensator comprises a Proportional-Integral-Derivative (PID) controller comprising an integral register configured to store a value indicative of the input voltage.

4. The control circuit of claim 3, wherein one or more of a proportional gain, an integral gain, or a derivative gain of the PID controller is scaled by the value indicative of the input voltage.

5. The control circuit of claim 4, wherein the digital compensator is configured to generate the compensator signal during a first portion of cycles of a system clock signal and the gain of the digital compensator is scaled by the value indicative of the input voltage during a second portion of clock cycles different than the first portion of cycles of the system clock signal.

6. The control circuit of claim 1, wherein the digital compensator is further responsive to a feedforward signal indicative of a variation in the input voltage.

7. The control circuit of claim 1, wherein the voltage regulator is a DC-DC converter.

8. The control circuit of claim 7, wherein the DC-DC converter is a buck regulator.

9. A method for generating a voltage control signal for controlling a switch of a voltage regulator configured to convert an input voltage into a regulated output voltage, the switch operating at a switching frequency and the voltage regulator further comprising an output filter having a corner frequency, comprising:
    generating a feedback control signal based on a voltage difference between the regulated output voltage and a reference voltage;
    generating a duty cycle word with a digital compensator in response to the feedback control signal, comprising computing a compensator gain that is independent of the switching frequency; and
    converting the duty cycle word into the voltage control signal with a pulse width modulator.

10. The method of claim 9, wherein the voltage regulator has a crossover frequency established by at least one pole and at least one zero, the method further comprising setting the corner frequency of the output filter to have a first fixed, predetermined relationship with respect to the switching frequency, a second, fixed predetermined relationship with respect to the crossover frequency, and a third fixed, predetermined relationship with respect to the at least one pole and at least one zero.

11. The method of claim 9, wherein generating the duty cycle word comprises providing a digital compensator with a proportional-Integral-Derivative (PID) controller.

12. The method of claim 11, wherein providing the digital compensator with a PID controller comprises providing an integral register in which a value indicative of the input voltage is stored and wherein computing the compensator gain comprises scaling one or more of a proportional gain, an integral gain, or a derivative gain of the PID controller by the value indicative of the input voltage.

13. The method of claim 9, wherein generating the duty cycle word comprises generating the duty cycle word in response to the feedback control signal and to a feedforward signal.

14. The method of claim 9, wherein generating the feedback control signal comprises:
    dividing the regulated output voltage to generate a divided voltage having a value that is a fraction of the regulated output voltage;
    generating an error voltage indicative of a difference between the divided voltage and the reference voltage; and
    converting the error voltage into a digital signal to generate the feedback control signal.

15. A control circuit for a voltage regulator comprising at least one switch responsive to a voltage control signal for switching at a switching frequency and an output filter having a corner frequency, the voltage regulator having a crossover frequency established by at least one pole and at least one zero and configured to convert an input voltage into a regulated output voltage, comprising:
    a divider coupled to the regulated output voltage to generate a divided voltage having a value that is a fraction of the regulated output voltage;
    an error amplifier responsive to the divided voltage and to a reference voltage to generate an error voltage indicative of a difference between the divided voltage and the reference voltage;
    an ADC responsive to the error voltage to generate a feedback control signal;
    a digital compensator responsive to the feedback control signal to generate a compensator signal; and
    a pulse width modulator responsive to the compensator signal to generate the voltage control signal,
    wherein the corner frequency of the output filter has a first fixed, predetermined relationship with respect to the switching frequency, a second fixed, predetermined relationship with respect to the crossover frequency, and a third fixed, predetermined relationship with respect to the at least one pole and at least one zero.

16. The control circuit of claim 15, wherein the digital compensator comprises a PID controller comprising an integral register configured to store a value indicative of the input voltage.

17. The control circuit of claim 16, wherein one or more of a proportional gain, an integral gain, or a derivative gain of the PID controller is scaled by the value indicative of the input voltage.

18. A control circuit for a voltage regulator comprising at least one switch responsive to a PWM voltage control signal for switching at a switching frequency and an output filter having a corner frequency, the voltage regulator configured to convert an input voltage into a regulated output voltage, comprising:

means for dividing the input voltage to generate a divided voltage having a value that is a fraction of the input voltage;

means for generating an error signal indicative of a difference between the divided voltage and a reference voltage;

means for converting the error voltage into a digital feedback control signal;

means responsive to the digital feedback control signal and comprising a gain parameter that is inversely proportional to the input voltage and is independent of the switching frequency for generating a compensator signal indicative of a duty cycle for the switch; and means for generating the PWM voltage control signal in response to the compensator signal.

19. The control circuit of claim 18, wherein the voltage regulator has a crossover frequency established by at least one pole and at least one zero and wherein the corner frequency of the output filter has a first fixed, predetermined relationship with respect to the switching frequency, a second fixed, predetermined relationship with respect to the crossover frequency, and a third fixed, predetermined relationship with respect to the at least one pole and at least one zero.

20. The control circuit of claim 18, wherein the compensator signal generating means comprises a PID controller comprising an integral register configured to store a value indicative of the input voltage.

21. The control circuit of claim 20, wherein one or more of a proportional gain, an integral gain, or a derivative gain of the PID controller is scaled by the value indicative of the input voltage.

* * * * *

UNITED STATES PATENT AND TRADEMARK OFFICE
CERTIFICATE OF CORRECTION

PATENT NO. : 10,181,791 B2  
APPLICATION NO. : 15/876641  
DATED : January 15, 2019  
INVENTOR(S) : Kapil Kesarwani et al.

Page 1 of 1

It is certified that error appears in the above-identified patent and that said Letters Patent is hereby corrected as shown below:

In the Specification

Column 8, Line 36, delete "coupled a node" and replace with --coupled to a node--

Column 10, Line 41, delete "logic gate," and replace with --logic gate output 1212d,--

Column 11, Line 53, delete "substantially less the" and replace with --substantially less than the--

Column 12, Line 47, delete "Gvd(s) given" and replace with --Gvd(s) is given--

Column 14, Line 8, delete "provided by compensator" and replace with --provided by the compensator--

Column 14, Line 13, delete "poles of LC filter" and replace with --poles of the LC filter--

Column 14, Line 36, delete "it can be see that" and replace with --it can be seen that--

Column 15, Line 67, delete "534, 538" and replace with --534, 538.--

Column 16, Line 55, delete "overheard to entire" and replace with --overhead to the entire--

Column 17, Line 10, delete "that that scope" and replace with --that the scope--

Signed and Sealed this  
Twenty-sixth Day of February, 2019

Andrei Iancu  
*Director of the United States Patent and Trademark Office*